(12) United States Patent
Koppelaar

(10) Patent No.: US 7,185,267 B2
(45) Date of Patent: Feb. 27, 2007

(54) NON LINEAR SCALING OF RELIABILITY VALUES IN A TURBO DECODER SYSTEM

(75) Inventor: Arie Geert Cornelis Koppelaar, Eindhoven (NL)

(73) Assignee: NXP BV., Eindhoven (NL)

( * ) Notice: Subject to any disclaimer, the term of this patent is extended or adjusted under 35 U.S.C. 154(b) by 426 days.

(21) Appl. No.: 10/277,567

(22) Filed: Oct. 22, 2002

(65) Prior Publication Data

US 2003/0088820 A1    May 8, 2003

(30) Foreign Application Priority Data

Oct. 25, 2001    (EP) ................................. 01204083

(51) Int. Cl.
*H03M 13/03* (2006.01)
*H03M 13/00* (2006.01)

(52) U.S. Cl. ................. 714/794; 714/795; 714/755

(58) Field of Classification Search ............... 714/794, 714/795, 755; 375/262, 341
See application file for complete search history.

(56) References Cited

U.S. PATENT DOCUMENTS 6,029,264 A * 2/2000 Kobayashi et al. ......... 714/755
6,145,114 A 11/2000 Crozier et al. ............. 714/794
6,223,319 B1 4/2001 Ross et al. ................. 714/755
6,671,335 B1 * 12/2003 Kim et al. .................. 375/340

OTHER PUBLICATIONS

H. Kobayashi et al., "On Decoding of Correlative Level Coding Systems with Ambiguity Zone Detection", IEEE Transactions on Communication Technology, vol. COM-19, No. 4 Aug. 1971, pp. 467-477.*
Z. Blazek et al; "A DSP Based Implementation of a Turbo-Decoder", IEEE GLOBECOM 1998, The Bridge to Golbal Integration, Sydney, Nov. 8-12, 1998, IEEE Global Telecommunications Conf, NY vol. 5, pp. 2751-2755, XP000801545.
J. Vogt et al; "Reducing Bit Width of Extrinsic Memory in Turbo Decoder Realisations", Electronics Letters, IEE Stevenage, GB, vol. 36, No. 20, Sep. 28, 2000, pp. 1714-1716, XP006015740.

* cited by examiner

*Primary Examiner*—Joseph D. Torres

(57) ABSTRACT

A decoder system for concatenated codes such as turbo codes, comprises at least two component decoders mutually coupled through a reliability value handler for handling reliability values. The reliability value handler comprises a scaling unit for providing non linearly scaled reliability values. This reduces the reliability values provided by the component decoders, such that the non linearly scaled reliability values better reflect the genuine reliability information or Log Likelihood Ratio (LLR) in a practical realization of the decoder system generally having sub optimal component decoders.

21 Claims, 2 Drawing Sheets

NON LINEAR SCALING OF RELIABILITY VALUES IN A TURBO DECODER SYSTEM

The present invention relates to a decoder system for concatenated codes such as turbo codes, comprising at least two component decoders mutually coupled through a reliability value handler for handling reliability values.

The present invention also relates to a receiver comprising such a decoder system, to a method for decoding concatenated codes, such as turbo codes which are iteratively decoded, and whereby after being decoded and quantised, reliability values are being de-quantised, as well as to associated signals.

Such a decoder system is known from an article entitled: "Design of Fixed-Point Iterative Decoders for Concatenated Codes with Interleavers" by G. Montorsi and S. Benedetto, published in Globecom 2000 (November). The known decoder system includes decoder configurations for concatenated codes, such as parallel or serially concatenated codes for example turbo codes. The decoder configuration comprises so called SISO (Soft-Input Soft-Output) component decoders, which are mutually coupled through addressing units acting as interleavers and de-interleavers. Each component decoder outputs extrinsic information in the form of reliability information, called LLR (Log Likelihood Ratio) information, if SISO decoders are used. The reliability information output by the component decoders originally is in analog form, which may be quantised in a quantiser before being fed to the addressing unit. The reliability information is represented by a binary value. The bits of the binary reliability value are mapped on the total range of the original analog reliability information in a number of bits, which preferably is as small as possible. However the magnitude of the reliability value increases as the iterations progress. So in order to cope with an increasing reliability information dynamic it is proposed to progressively decrease the precision by which the reliability information is represented by its associated reliability value bits. By applying this form of precision correction it is possible to accommodate for a larger dynamic reliability information range, which is required at an increasing number of iterations.

After being processed in the addressing unit the binary reliability value is de-quantised in a de-quantiser, wherein the original reliability value is restored, given the precision corrected value of the binary reliability information.

It has been found that this known decoder system in practice does not always perform as good and reliable as expected.

Therefore it is an object of the present invention to provide a decoder system, whose decoder performance is improved.

Thereto the decoder system according to the invention is characterized in that the reliability value handler comprises a scaling unit for providing non linearly scaled reliability values.

Accordingly the method according to the invention is characterized in that the reliability values are subjected to a non linear scaling.

It has been found by the inventor that practically built component decoders do not always provide accurate and reliable reliability information. Under those circumstances the reliability information which is actually exchanged between the component decoders is found to be too optimistic. In accordance therewith it is proposed to non linearly scale the reliability values in the decoder system according to the invention. The effect of a possible non linear scaling is that such a scaled reliability value may express a lower, but more accurate and more exact value, which reflects the actual practically realized reliability of the reliability information better.

Experiments have confirmed that the non linear scaling of reliability information generally provided by the component decoders as reliability values, improves the performance of iterative decoders in the system according to the invention, in that a lower word error rate (WER) and a lower bit error rate (BER) is obtained with the same number of iterations as without such scaling. Conversely the same WER and BER respectively can be reached with less iterations, which saves valuable signal handling time and processing in the decoder system according to the invention.

An embodiment of the decoder system according to the invention is characterized in that the scaling unit has one or more scaling control inputs and is equipped for performing a scaling in dependence on one or more of the following scaling control signals:

(a) a scaling control signal which depends on the amount of correlation between inputs of the component decoders;

(b) a scaling control signal which depends on the number of iterations or on the number of the iteration performed by the component decoders;

(c) a scaling control signal which depends on an actual bit error rate;

(d) a scaling control signal which depends on the type of decoder applied as component decoder;

(e) a scaling control signal which depends on a signal to noise ratio at the decoder system;

(f) a scaling control signal which depends on an expected fading at the decoder system.

Advantageously a choice can be made as to the particular dependency of the non linear scaling from items included in various scaling control signals. This means that the non linear scaling concerned can be performed when either one, or more of the above mentioned or similar items tending to jeopardize the required performance of the decoder system according to the invention. By applying the non linear scaling in dependency on one or more of the above items a steady high decoding performance can be maintained. Of course it is also possible to choose one or a combination of scaling control signals having associated dependencies. This way a switching may be performed from one scaling dependency to another or put otherwise from one of such or similar items influencing the non linear scaling to another. This way even a dynamic/adaptive non linear scaling of reliability values is achievable, where the particular way of influencing the non linear scaling may depend on the item which is important at a particular moment.

A further embodiment of the decoder system according to the invention is characterized in that the reliability value handler comprises a quantiser for providing quantised reliability values, and that the scaling of the reliability values by the scaling unit is performed on the basis of a non linear scaling of mid-values of the quantised reliability values.

The effect of the non linear scaling of the mid-values may be that such a non linear scaled mid-value upon de-quantisation represents an associated reliability value which differs from the original reliability value, but which better reflects the genuine reliability acquired.

In a flexible elaboration of the further embodiment the decoder system according to the invention is characterized in that the non linear scaling of the mid-values performed by the scaling unit is such that a different scaling factor is applied for every separate reliability value.

A still further embodiment of the decoder system according to the invention is characterized in that the reliability value handler comprises addressing units in the form of interleavers and de-interleavers interspersed between the component decoders.

These addressing units having interleavers and de-interleavers are known to comprise addressing memory. Advantageously the amount of memory of the addressing units applied in the decoder system according to the invention may decrease, which may even decrease significantly if quantisation of the reliability values can be optimized by means of combining quantisation with the non linear scaling, such that a smaller number of bits is needed for coding the reliability information than without such scaling; without however adversely influencing the proper decoder performance.

Another embodiment of the decoder system according to the invention is characterized in that the decoder system comprises one or more of the following types of component decoders: a log APP decoder, a max log APP (MAP) decoder, a soft output Viterby (SOV) decoder, or similar concatenated code decoder.

This embodiment exemplifies some of the types of decoders which may be applied as sub optimal decoders and whose reliability information would be too optimistic also if no non linear scaling of the reliability decision intervals would have been applied. Due to this non linear scaling the performance of these types of decoders has improved, because their output reliability information now better reflects the genuine reliability of information decoded by the component decoders.

At present the decoder system and associated features according to the invention will be elucidated further together with their additional advantages, while reference is being made to the appended drawing, wherein similar components are being referred to by means of the same reference numerals.

Turbo codes are a form of parallel concatenated codes known to the man skilled in the art of channel coding theory, since a first article entitled: 'Near Shannon Limit Error-Correcting Coding and Decoding; Turbo Codes', by C. Berrou, A. Glavieux, and P. Thitimajshima, IEEE Proceedings of ICC '93, pp 1064–1070, May 1993. Turbo coding is a form of channel coding known for its outstanding Bit Error Rate (BER). Such coding can for example be applied in all kinds of communication devices, such as future UMTS devices, deep space receivers, or devices like hard discs, telemetry devices, or digital networks, such as local area networks and the like, where reliable communication possibly in a low signal to noise environment is of vital importance.

Figure 1:
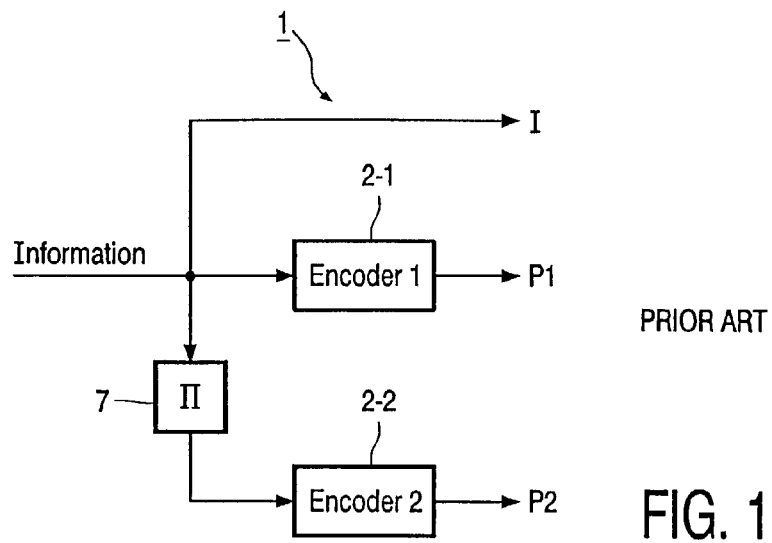
FIG. 1 shows by way of example a schematic embodiment of a turbo encoder according to the prior art.
Figure 2:
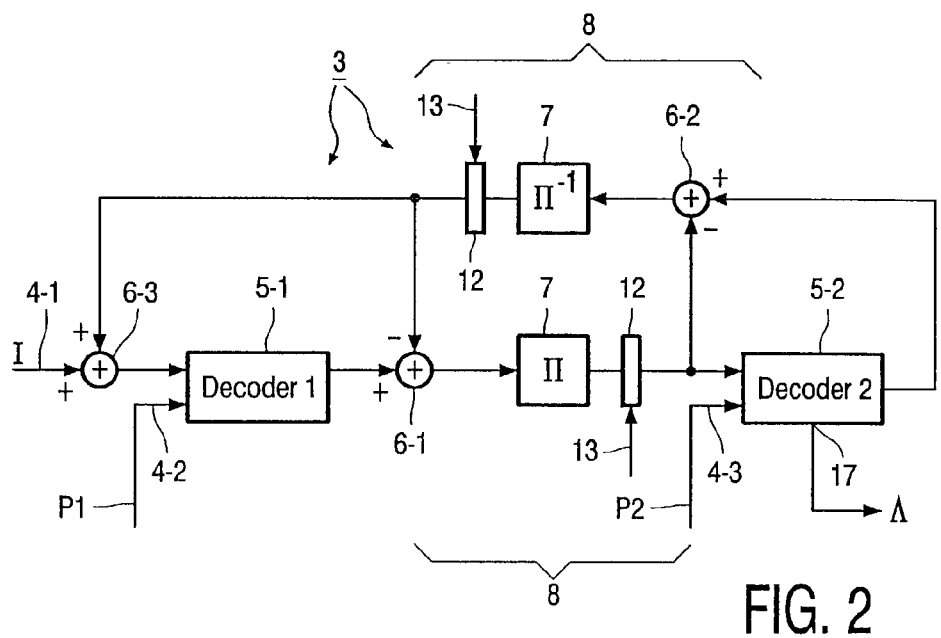
FIG. 2 shows an embodiment of the decoder system according to the invention.

Just by way of example FIG. 1 shows an embodiment of a encoder system 1 according to the prior art. Its functioning will be summarized as follows. The encoders 2-1, 2-2 map incoming bits of an information word to a code word comprising bits I, P1, P2, which code word is to be sent over a transmission channel (not shown). In this case for each input bit of the information word three output bits I, P1, P2 are produced, resulting in a rate 1/3 code. Of all possible messages only that fraction of messages is used for encoding which have the largest mutual Euclidean distances, in order to minimize the probability that an incorrect code word will be received at the side of a decoder system 3, such as shown in FIG. 2. In the case as shown the encoder system 1 comprises two recursive systematic encoders 2-1, 2-2, each comprising delay lines and adders (circled additions), the latter being coupled as shown in FIG. 2. The two encoders 2-1, 2-2 are separated by an addressing unit in the form of an interleaver Π for dividing the input information bit stream in information blocks having a certain length of for example 150 bits, and shuffling these blocks. In UMTS applications the interleaver size may range from 320–5120 samples. For each input bit the three output bits are produced, which are (possibly after appropriate mapping): a systematic bit I, a reliability bit P1 of encoder 2-1 and a reliability bit P2 of encoder 2-2. After processing N input bits the encoders 2-1, 2-2 terminate their so called trellis, which is a well known delay line state diagram as a function of the time. This results in 6 additional bits that is 3 systematic and 3 reliability bits for each trellis. The encoded output bits I, P1, P2 are then sent over the transmission channel to a decoder system inputs 4-1, 4-2, 4-3 of the decoder system 3.

The decoder system 3 exemplified in FIG. 2 has the structure of a concatenated decoder system having a first Soft Input/Soft Output (SISO) component block decoder 5-1 and a second SISO block decoder 5-2, mutually coupled in a feedback arrangement. Quantisers and de-quantisers are omitted from FIG. 2. Block decoders 5-1 and 5-2 are executed for decoding an input received from the transmission channel, which received input is representative for the encoded signals I, P1 and P2. During a first iteration a reliability output of block decoder 5-1 after negatively adding thereto a-priori information in adder 6-1, is processed in an interleaver Π and then used as a-priori information in block decoder 5-2, together with a received signal which is representative for reliability P2. During a next iteration a reliability output of block decoder 5-2, whereto in adder 6-2 the negative reliability output of interleaver Π has been added, is de-interleaved in an addressing unit in the form of a de-interleaver $\Pi^{-1}$, whose output is used in two adders 6-3 and 6-1 as fed back a-priori reliability information for further decoding by block decoder 5-1, together with a received signal which is representative for reliability P1. This decoding schedule can be continued until some iteration stop criterion implemented is met, where after an output signal Λ is provided on output 17 of block decoder 5-2, which will then if necessary be de-interleaved and de-mapped to provide a turbo decoded output signal of the turbo decoder system 3 concerned.

Of course various modifications comprising more than two properly configured component decoders 5, such as 5-1 and 5-2 and reliability value handlers, such as adders 6 and interleavers Π, $\Pi^{-1}$, acting as addressing units 7 are feasible for implementing wanted decoding schemas. The reliability information processed by and circulating in the system 3 through the reliability value handlers is herein referred to by 8, indicating all reliability handling components present between the decoders 5-1 and 5-2. For ease of description the information signal I will also be considered to be included in the reliability information. The reliability information provides reliability information and in case of the above component decoders it may be considered to represent, well known Log Likelihood Ratios (LLR), although this is not always the case.

Figure 3:
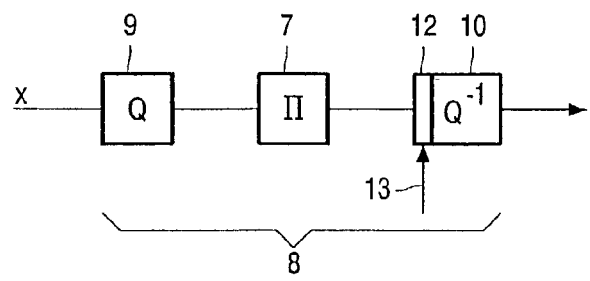
FIG. 3 shows a part of a reliability value handler for possible application in the decoder system of FIG. 2.

Reference is now made to FIG. 3, where a part of the reliability value handler 8 is shown which includes an addressing unit 7 and a quantiser 9 and a de-quantiser 10 sandwiching the unit 7, which in the case as shown is an interleaver, but may well include a de-interleaver. Reliability information x is possibly in sampled form fed to the quantiser 9 and quantised, where the reliability output value $i_n$, may for example include eight reliability values or quantisation intervals, which may then be coded by three reliability bits. These reliability bit representations are then interleaved in addressing interleaver 7 and de-quantised in de-quantizer 10.

Figure 4:
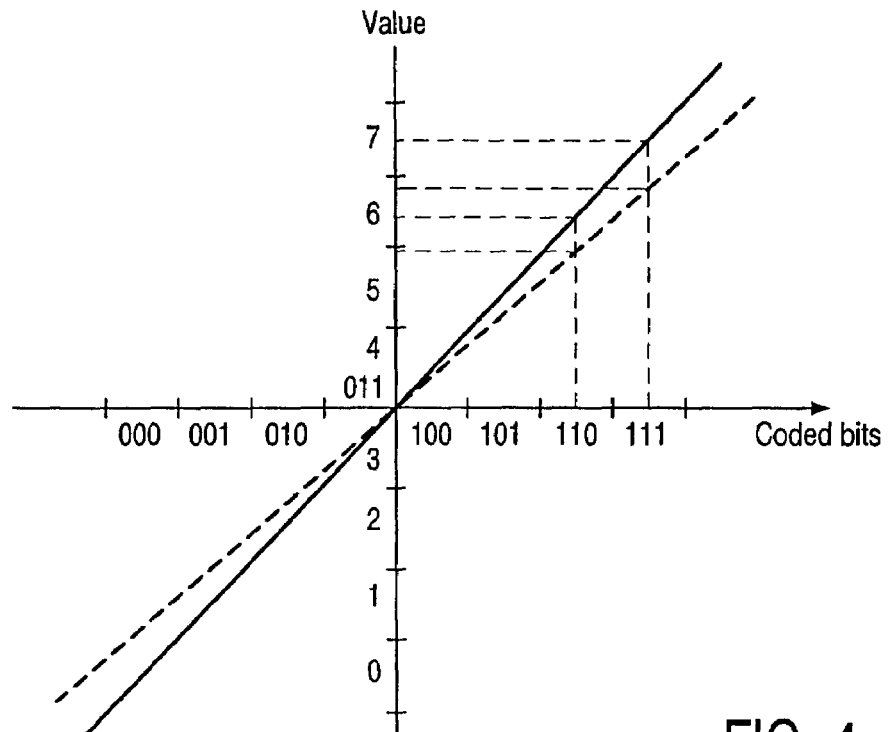
FIG. 4 shows a graph of reliability values against binary coded reliability bits for explaining the decoder system and the method according to the invention.

FIG. 4 shows a graph of the reliability values against binary coded reliability bits for explaining the operation of the decoder system 3. Starting at a reliability value somewhere on the vertical axes of the graph the corresponding binary reliability bit value can easily be determined by the quantiser 9 from the intersection with the drawn line, indicating the one to one relation between the reliability value and the binary bit value or bit representation concerned. In general this also holds for the reverse case even if the interval width is adjusted in order to cope with an increasing dynamic range as proposed in the article in Globecom 2000 (November) referred to in the preamble of the description. In fact a linear scaling would have points of intersection which are all situated on the drawn line.

The effects due to a non linear scaling proposed here can be seen by viewing at the dotted line in FIG. 4. Upon de-quantising, that is starting from the horizontal axes in the middle of a binary bit interval the intersection with the dotted line and its projection on the vertical indicates the de-quantised reliability value of that binary value if the meant non linear scaling is applied. Starting from for example binary value 111 it is to be noted that its midvalue might (depending on the tangent of the dotted line) end up in decision interval 6 and not in interval 7, as would normally be the case. The same bit reduction or bit compression for the case as shown holds for the binary value 110, which ends up in interval 5 instead of 6. This means that in this case a scaling down takes place, which reduces the number of reliability values, but which is justified as the normal de-quantised value would be too optimistic. The non linearly scaled value is reduced by some factor for example 0.7, representing a more reliable reliability information or LLR value. The actual non linear scaling action can be performed somewhere in the reliability value handlers' 8 components, such as shown in FIGS. 2 and 3, for example in a separate scaling unit 12, in de-quantiser 10, or elsewhere in the reliability value handler 8.

The non linear scaling may be controlled in dependence on one or more of the following scaling control signals:

(a) a scaling control signal which depends on the amount of correlation between either or not iterating inputs of the component decoders 5-1, 5-2;

(b) a scaling control signal which depends for example on the number of iterations or on the number of the iteration performed by the component decoders 5-1, 5-2;

(c) a scaling control signal which depends on an actual bit error rate, measured at an appropriate place in the decoder system 3;

(d) a scaling control signal which depends on the type of decoder 5-1, 5-2 applied as component decoder;

(e) a scaling control signal which depends on a signal to noise ratio at or in the decoder system 3;

(f) a scaling control signal which depends on an expected fading at the decoder system 3.

Thereto the scaling unit 12 or if combined with the de-quantiser the de-quantiser 10 itself is provided with a scaling control input 13 for one or more of the above mentioned scaling control signals. Examples of applicable types of generally sub optimal component decoders are: a log APP decoder, a max log APP (MAP) decoder, a max* log APP decoder, a Soft Output Viterby (SOV or SOV Algorithm) decoder, or a similar concatenated code decoder.

Figure 5:
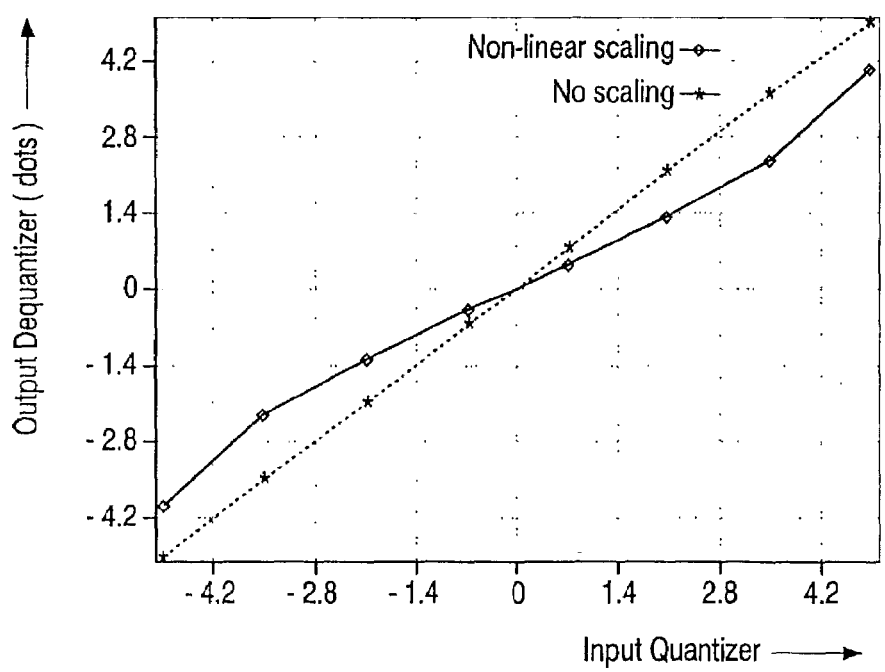
FIG. 5 shows a drawn graph of a non linear assembly of non linear corrected midvalues and a comparative dotted graph representing the prior art method.

If necessary the non linear scaling could be performed such that each quantised reliability value has a fixed scaling factor as indicated in the above. However possibly in dependence on one or more of the above items each binary reliability interval may have its own individual scaling factor. An example thereof will now be given. Suppose the component decoders 5-1, 5-2 use reliability value intervals of 1.4. Then the reliability value decision boundaries shown along the vertical in FIG. 3 would be at −4.2; −2.8; −1.4; 0.0; 1.4; 2.8; and 4.2 having corresponding midvalues at −4.9; −3.5; −2.1; −0.7; 0.7; 2.1; 3.5; and 4.9 respectively. Suppose the possibly dynamically designated various scaling factors are: 0.82; 0.66; 0.62; 0.57; 0.57; 0.62; 0.66; and 0.82 then the non linear scaled midvalues are: −4.0; −2.3; −1.3; −0.4; 0.4; 1.3; 2.3; and 4.0 respectively, which are the non linear corrected midvalues provided by the scaling unit 12 or de-quantiser 10. The latter very non linear assembly of non linear corrected midvalues is illustrated in FIG. 5 by the drawn line, which may be compared to the no scaling or only stretched case of the prior art above.

Whilst the above has been described with reference to essentially preferred embodiments and best possible modes it will be understood that these embodiments are by no means to be construed as limiting examples of the devices concerned, because various modifications, features and combination of features falling within the scope of the appended claims are now within reach of the skilled person. For example for each iteration number a different scaling can be performed.

The invention claimed is:

1. A decoder system for concatenated codes, comprising:
a reliability value handler for handling reliability values; and
at least two component decoders mutually coupled through the reliability value handler, wherein the reliability value handler comprises:
a quantizer for quantizing said reliability values according to quantization steps using respective midpoints from a binary bit interval, said midpoints having respective absolute magnitudes; and
a dequantizer configured for calculating reductions in said absolute magnitudes and for, in response to inputted ones of the quantized reliability values, selectively outputting quantities whose magnitudes are derived from ones of the reduced magnitudes.

2. The decoder system according to claim 1, characterized in that the dequantizer has one or more scaling control inputs and is equipped for performing the reductions in dependence on one or more of the following scaling control signals:

(a) a scaling control signal which depends on the amount of correlation between inputs of the component decoders;

(b) a scaling control signal which depends on the number of iterations or on the number of the iteration performed by the component decoders;

(c) a scaling control signal which depends on an actual bit error rate;

(d) a scaling control signal which depends on the type of decoder applied as component decoder;

(e) a scaling control signal which depends on a signal to noise ratio at the decoder system;

(f) a scaling control signal which depends an an expected fading at the decoder system.

3. The decoder system according to claims 1, characterized in that the reliability value handler comprises addressing units in the form of interleavers and de-interleavers interspersed between the component decoders.

4. The decoder system according to claim 1, characterized in that the decoder system comprises one or more of the following types of component decoders: a log APP decoder, a max log APP (MAP) decoder, and a max* log APP decoder, a soft output Viterby (SOV) decoder.

5. A receiver comprising a decoder system according to claim 1.

6. The system of claim 1, wherein said concatenated codes comprise turbo codes.

7. The system of claim 1, configured such that the reductions are dynamically adaptive.

8. The system of claim 1, wherein said calculating of the reduced magnitudes comprises reducing by percentages that vary with midpoint whose absolute magnitude is being reduced to create the respective reduced magnitude.

9. The system of claim 1, wherein said quantizing and dequantizing by said quantizer and said dequantizer, respectively, are performed serially iteration by iteration, the iterations being numbered, said dequantizer being responsive to the number of a current one of the iterations.

10. The decoder system of claim 1, wherein difference between a largest and smallest of said respective midpoints is greater than difference between a largest and smallest of said quantities.

11. The decoder system of claim 1, wherein said calculating comprises non-linearly scaling down said absolute magnitudes.

12. The decoder system of claim 1, wherein no two of the quantities outputted for respectively different quantized reliability values are equal.

13. A decoder system for concatenated codes, comprising:
a reliability value handler for handling reliability values; and
at least two component decoders mutually coupled through the reliability value handler, wherein the reliability value handler comprises a scaling unit for providing non linearly scaled reliability values, characterized in that the reliability value handler comprises a quantiser for providing quantised reliability values, and that the scaling of the reliability values by the scaling unit (12) is performed on the basis of a non linear scaling of mid-values of the quantised reliability values, characterized in that the non linear scaling of the mid-values performed by the sealing unit is such that a different sealing factor is applied for every quantised reliability value.

14. The decoder system of claim 13, wherein the applying of the different scaling factors comprises multiplying respect ones of the mid-values by associated ones of said different scaling factors.

15. The decoder system of claim 14, wherein said mid-values are mid-values of respective quantization steps, said quantiser serving to map said respective quantization steps correspondingly to said quantised reliability values.

16. The decoder system of claim 13, wherein said mid-values are mid-values of respective quantization steps, said quantiser serving to map said respective quantization steps correspondingly to said quantised reliability values.

17. The decoder system of claim 16, wherein said scaling of said mid-values constitutes scaling down of said mid-values.

18. The decoder system of claim 16, wherein said scaling unit comprises a dequantizer configured for selecting from among said non-linearly scaled mid-values, said selecting constituting dequantizing of a respective one of said quantised reliability values.

19. The decoder of claim 13, wherein said scaling of said mid-values constitutes scaling down of said mid-values.

20. The decoder of claim 13, wherein said reliability value handler further comprises a dequantizer that comprises said scaling unit, said quantiser being configured for quantizing said reliability values according to quantization steps whose respective midpoints are said mid-values, said midpoints having respective absolute magnitudes that said non linear scaling non-linearly scales.

21. A decoding method for concatenated codes, comprising:
quantizing reliability values from a decoder according to quantization steps using respective midpoints from a binary bit interval, said midpoints having respective absolute magnitudes; and
calculating reductions in said absolute magnitudes and, in response to inputted ones of the quantized reliability values, selectively outputting, to another decoder, quantities whose magnitudes are derived from ones of the reduced magnitudes.

* * * * *

UNITED STATES PATENT AND TRADEMARK OFFICE
CERTIFICATE OF CORRECTION

| | | |
|---|---|---|
| PATENT NO. | : 7,185,267 B2 | Page 1 of 1 |
| APPLICATION NO. | : 10/277567 | |
| DATED | : February 27, 2007 | |
| INVENTOR(S) | : Koppelaar | |

It is certified that error appears in the above-identified patent and that said Letters Patent is hereby corrected as shown below:

On the Title Page, in Item (73), under "Assignee", in Column 1, Line 1, delete "NXP BV.," and insert -- NXP B.V., --, therefor.

On the Title Page, in Item (56), under "OTHER PUBLICATIONS", in Column 2, Line 6, delete "Golbal" and insert -- Global --, therefor.

In The Specification

In Column 3, Line 19, delete "Viterby" and insert -- Viterbi --, therefor.

In Column 3, Line 64, delete "a encoder" and insert -- an encoder --, therefor.

In Column 6, Line 9, delete "Viterby" and insert -- Viterbi --, therefor.

In The Claims

In Column 7, Line 5, in Claim 2, delete "an an" and insert -- on an --, therefor.

In Column 7, Line 15, in Claim 4, delete "Viterby" and insert -- Viterbi --, therefor.

In Column 8, Line 2, in Claim 13, delete "unit (12)" and insert -- unit --, therefor.

In Column 8, Line 5, in Claim 13, delete "sealing" and insert -- scaling --, therefor.

In Column 8, Line 6, in Claim 13, delete "sealing" and insert -- scaling --, therefor.

Signed and Sealed this
Third Day of May, 2016

Michelle K. Lee
*Director of the United States Patent and Trademark Office*